United States Patent
Kao et al.

(10) Patent No.: US 9,373,803 B2
(45) Date of Patent: Jun. 21, 2016

(54) ELECTRONIC DEVICE PACKAGE AND MANUFACTURING METHOD THEREOF

(71) Applicant: Wistron Corporation, New Taipei (TW)

(72) Inventors: Chi-Jen Kao, New Taipei (TW); Ko-Yu Chiang, New Taipei (TW); Yi-Kai Wang, New Taipei (TW); Tarng-Shiang Hu, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 14/451,452

(22) Filed: Aug. 5, 2014

(65) Prior Publication Data

US 2015/0236286 A1    Aug. 20, 2015

(30) Foreign Application Priority Data

Feb. 18, 2014  (TW) ............................. 103105306 A

(51) Int. Cl.
H01L 51/10 (2006.01)
H01L 51/00 (2006.01)
H01L 51/44 (2006.01)
H01L 51/52 (2006.01)

(52) U.S. Cl.
CPC .......... *H01L 51/107* (2013.01); *H01L 51/0097* (2013.01); *H01L 51/448* (2013.01); *H01L 51/5253* (2013.01); *Y02E 10/549* (2013.01)

(58) Field of Classification Search
CPC . H01L 51/107; H01L 51/0097; H01L 51/448; H01L 51/5253
See application file for complete search history.

(56) References Cited

U.S. PATENT DOCUMENTS

| 6,573,652 | B1 | 6/2003 | Graff et al. |
| 6,866,949 | B2 | 3/2005 | Ota et al. |
| 7,389,253 | B2 | 6/2008 | Townsend et al. |
| 8,278,820 | B2 | 10/2012 | Yu et al. |
| 2013/0045354 | A1 | 2/2013 | Nakamura |
| 2013/0200534 | A1 | 8/2013 | Shiobara et al. |

FOREIGN PATENT DOCUMENTS

| CN | 101930990 | 12/2010 |
| CN | 102771184 | 11/2012 |
| JP | 2009060086 | 3/2009 |
| TW | 201344856 | 11/2013 |

OTHER PUBLICATIONS

Office Action of Taiwan Counterpart Application with partial English translation, issued on Jan. 26, 2016, p. 1-p. 14, in which the listed references were cited.

*Primary Examiner* — Long Pham
(74) *Attorney, Agent, or Firm* — Jianq Chyun IP Office

(57) ABSTRACT

An electronic device package of the disclosure includes a gas barrier substrate, a base layer, an electronic device and a barrier film. The base layer is disposed on the gas barrier substrate and made of a light curing material. The electronic device is disposed on the base layer. The barrier film is disposed on the gas barrier substrate, in which the barrier film and the gas barrier substrate clad the electronic device and the base layer. The disclosure also provides a manufacturing method of an electronic device package.

19 Claims, 8 Drawing Sheets

ELECTRONIC DEVICE PACKAGE AND MANUFACTURING METHOD THEREOF

CROSS-REFERENCE TO RELATED APPLICATION

This application claims the priority benefit of Taiwan application serial no. 103105306, filed on Feb. 18, 2014. The entirety of the above-mentioned patent application is hereby incorporated by reference herein and made a part of this specification.

BACKGROUND OF THE DISCLOSURE

1. Field of the Disclosure

The disclosure generally relates to a package and a manufacturing method thereof, and more particularly, to an electronic device package and a manufacturing method thereof.

2. Description of Related Art

Along with the advancement of electronic technology, the electronic devices having rigid property are evolved to have flexible property, which is achieved by changing and developing the material which is used for fabricating the electronic devices. For example, a flexible substrate has widely replaced the hard and rigid glass substrate, and meanwhile, other parts in an electronic device are also requested to be fabricated with flexible materials such as organic material. However, when a flexible electronic device is fabricated with organic material, the ability of blocking moisture and oxygen-gas always becomes a problem to be eagerly solved. In order to effectively prolong the lifetime of the flexible electronic devices, various packaging structures have focused on improving the ability of blocking moisture and oxygen-gas.

SUMMARY OF THE DISCLOSURE

Accordingly, the disclosure is directed to an electronic device package with good ability of blocking moisture and oxygen-gas to prolong the lifetime of the electronic device.

The disclosure is directed to a manufacturing method of an electronic device package having good ability of blocking moisture and oxygen-gas.

The electronic device package of the disclosure includes a gas barrier substrate, a base layer, an electronic device and a barrier film. The base layer is disposed on the gas barrier substrate and made of a light curing material. The electronic device is disposed on the base layer. The barrier film is disposed on the gas barrier substrate, in which the barrier film and the gas barrier substrate clad the electronic device and the base layer.

In an embodiment of the disclosure, the electronic device includes a plurality of electronic device units and the electronic device units are independent from each other.

In an embodiment of the disclosure, the base layer includes a plurality of base layer units arranged in array and separated from each other, and each of the electronic device units is disposed on a corresponding one of the base layer units.

In an embodiment of the disclosure, the barrier film includes a plurality of barrier film units arranged in array and separated from each other, and each of the barrier film units overlays one of the electronic device units and one of the base layer units.

In an embodiment of the disclosure, the barrier film overlays the electronic device units and the base layer units.

In an embodiment of the disclosure, the gas barrier substrate includes a flexible substrate.

In an embodiment of the disclosure, the material of the gas barrier substrate includes an inorganic material.

In an embodiment of the disclosure, the area of the electronic device exposes a portion of the area of the base layer.

In an embodiment of the disclosure, the electronic device includes display components, light-emitting components, transistor components, solar cells or a combination thereof.

In an embodiment of the disclosure, the material of the electronic device includes an organic electronic device.

In an embodiment of the disclosure, the material of the base layer includes an ultraviolet light curable resin, a photoresist material, a light curable material or a combination of the aforementioned materials.

The manufacturing method of an electronic device package of the disclosure includes following steps: forming a base layer on a gas barrier substrate using a light curable material; after curing the light curable material into the base layer, forming an electronic device on the base layer; and forming a barrier film on the gas barrier substrate and attaching the barrier film to the gas barrier substrate so that the barrier film dads the electronic device and the base layer.

In an embodiment of the disclosure, the method of forming the electronic device includes forming a plurality of electronic device units on the base layer in which the electronic device units are independent from each other.

In an embodiment of the disclosure, the method of forming the base layer includes patterning the base layer into a plurality of base layer units, followed by forming each of the electronic device units on one of the base layer units.

In an embodiment of the disclosure, the barrier film is formed to overlay the electronic device units and the base layer units.

In an embodiment of the disclosure, the barrier film is formed to have a plurality of barrier film units respectively overlaying the stacks of the electronic device units and the base layer units.

In an embodiment of the disclosure, the manufacturing method of an electronic device package further includes cutting the gas barrier substrate into a plurality of substrate units, in which each of the electronic device units is located on one of the substrate units.

In an embodiment of the disclosure, the method of forming the base layer using the light curable material includes a lithography process.

In an embodiment of the disclosure, the base layer and the electronic device are fabricated by using a same machine.

Based on the depiction above, the electronic device package of the disclosure adopts the gas barrier substrate to package the electronic device and adopts a light curable material to form the base layer on the gas barrier substrate, wherein the electronic device is disposed on the base layer and the barrier film clads the electronic device and the base layer and is attached to the gas barrier substrate. Therefore, the electronic device package of the disclosure has improved ability of blocking moisture and oxygen-gas to prolong the lifetime of the electronic device.

In order to make the features and advantages of the present disclosure more comprehensible, the present disclosure is further described in detail in the following with reference to the embodiments and the accompanying drawings.

DESCRIPTION OF THE EMBODIMENTS

Figure 1A:
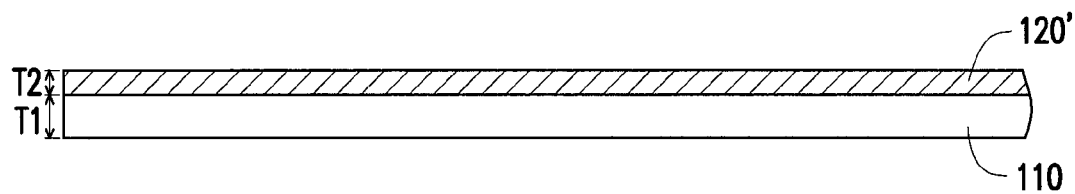
FIGS. 1A-1E schematically show the flows of the manufacturing method of an electronic device package according to the first embodiment of the disclosure.
Figure 1B:
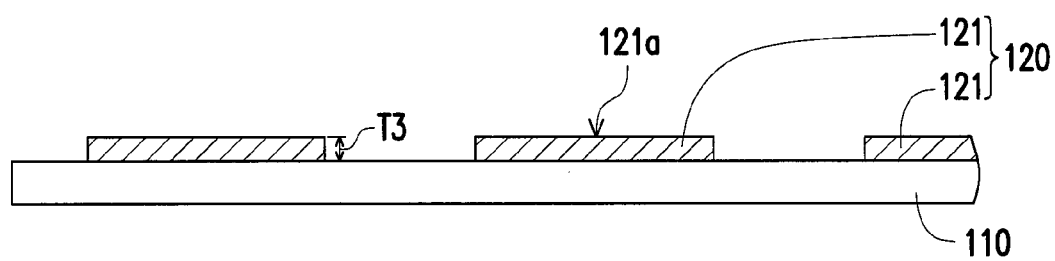
Figure 1C:
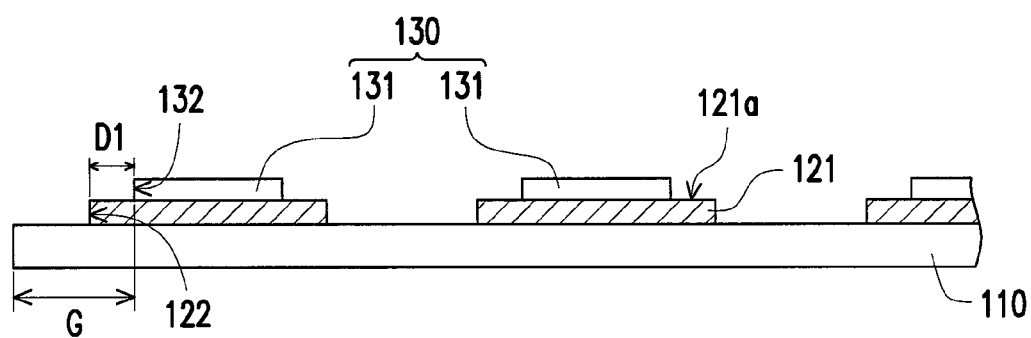
Figure 1D:
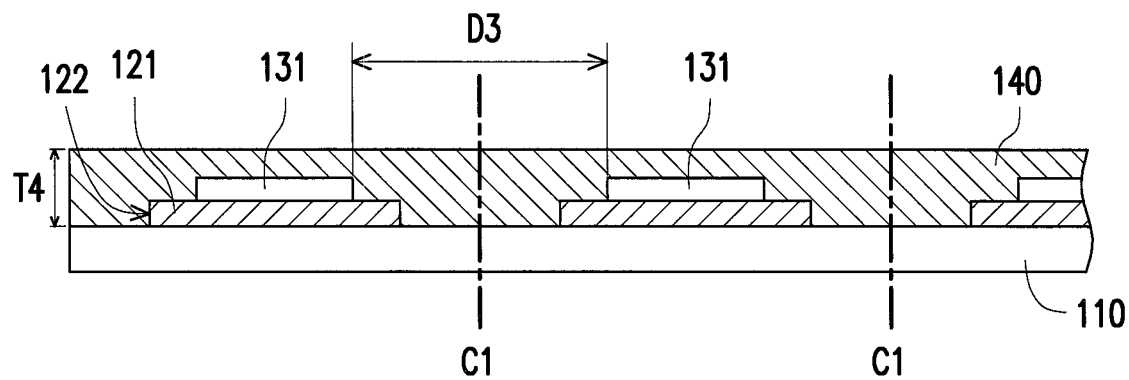
Figure 1E:
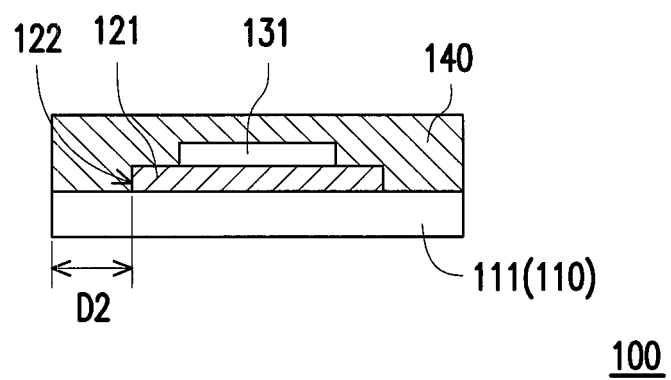
Figure 2A:
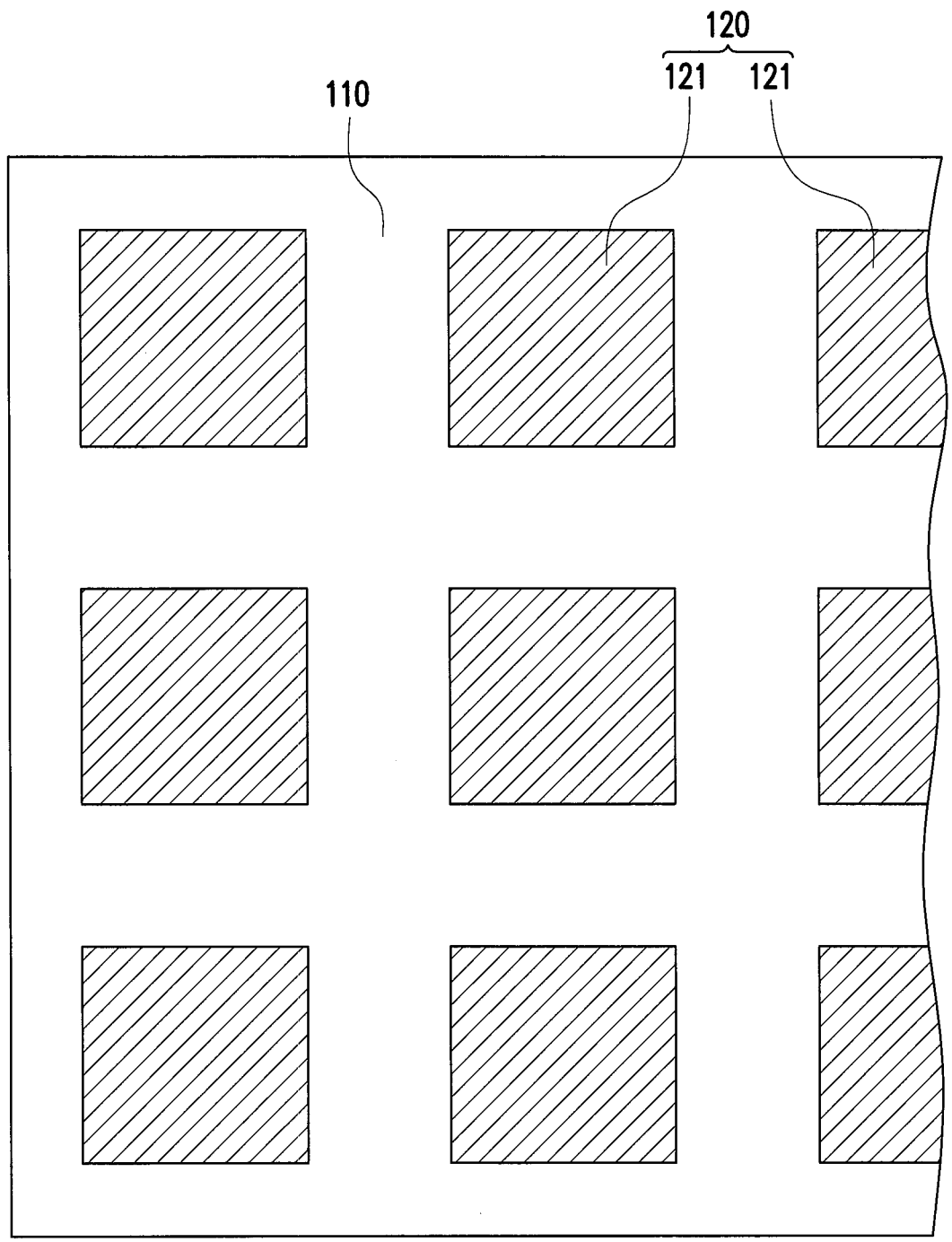
FIG. 2A is the top-view diagram of FIG. 1B.
Figure 2B:
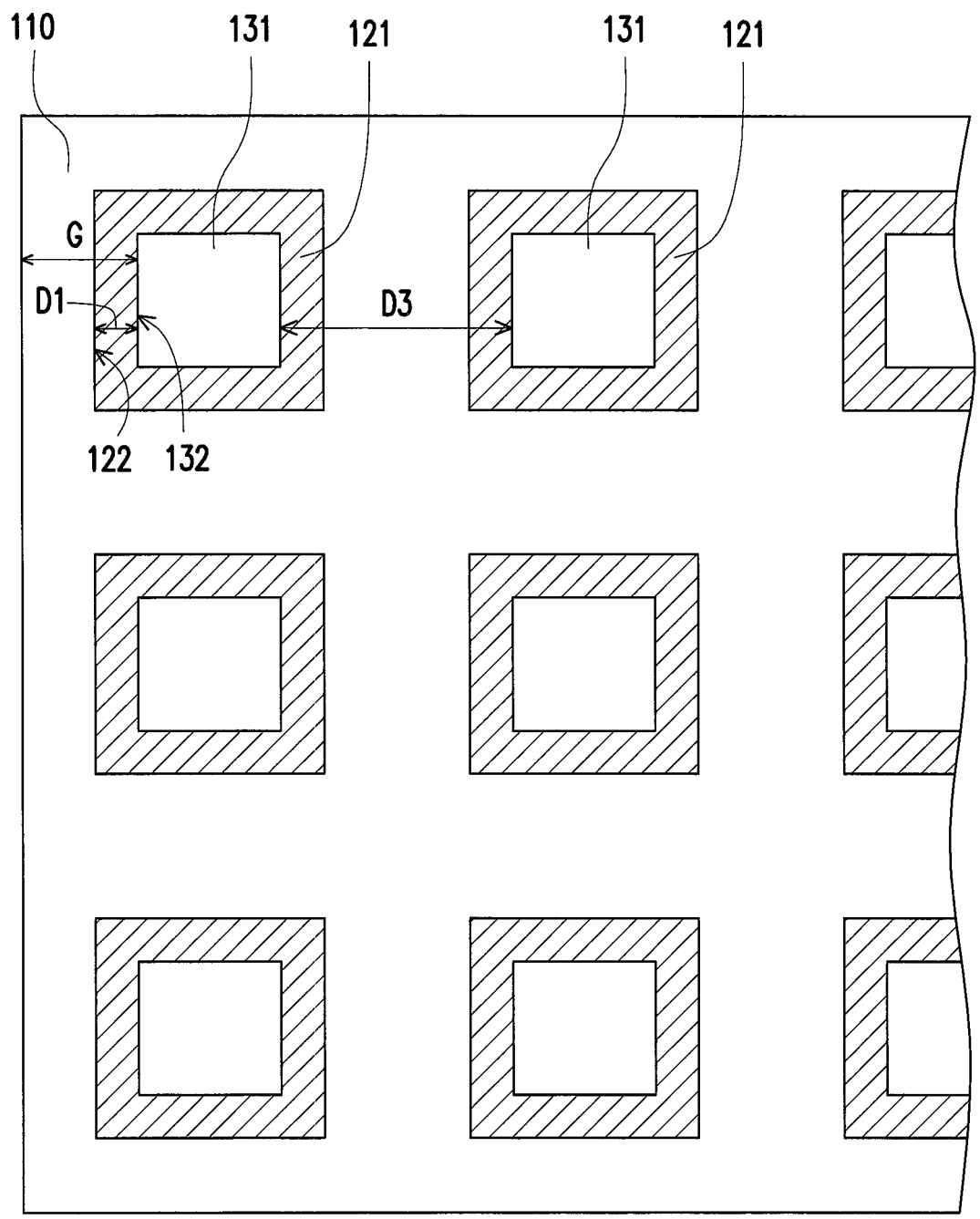
FIG. 2B is the top-view diagram of FIG. 1D.

FIGS. 1A-1E schematically show the flows of the manufacturing method of an electronic device package according to the first embodiment of the disclosure, FIG. 2A is the top-view diagram of FIG. 1B and FIG. 2B is the top-view diagram of FIG. 1D. Referring to FIG. 1A, first, a layer of light curing material 120' is formed on a gas barrier substrate 110. In the embodiment, the gas barrier substrate 110 is, for example, a flexible substrate made of an inorganic material such as metal (e.g., aluminium, iron), stainless steel, glass or ceramic, or organic material such as plastic material of polyethylene (PE) series, polymethyl methacrylate (PMMA), polycarbonate (PC) or polyimide (PI). The gas barrier substrate 110 can be multilayer substrate stacked by organic material and inorganic material or hard substrate, which the disclosure is not limited to. The thickness T1 of the gas barrier substrate 110, for example, ranges from 75 m to 200 m, and the water vapor transmission rate (WVTR) thereof is, for example, from 0.01 g/m$^2$/day to 0.001 g/m$^2$/day.

In general, the light curing material 120' can be formed on the gas barrier substrate 110 through spreading process and cured into a solid state after the irradiation to become a solid layer, in which the thickness T2 of the light curing material 120' spreading on the gas barrier substrate 110 is related with the material concentration/viscosity, and the thickness T2 is roughly from 1 m to 20 m. In the embodiment, the material of the light curing material 120' can be ultraviolet photographic resin cured that is cured and shaped after ultraviolet irradiation, other photosensitive resin, photoresist material, photocurable material or a combination of the above-mentioned materials, which the disclosure is not limited to. The material of the light curing material 120', for example, can include ultraviolet light curable resin such as epoxy resin, vinyl resin, acrylic resin or polyester resin, or common photoresist material on the market such as the photoresist materials fabricated by the industries such as Arizona Chemical Company, LLC, Eternal Materials Co., Ltd. or ChangChun Plastics Co., Ltd.. In addition, the material of the light curing material 120' can also be polyimide (PI), polyurethane (PU), polyethylene terephthalate (PEN), silicone or other photocurable materials.

Referring to FIG. 1B, a photolithography process is performed to cure and pattern the light curing material 120' into the base layer 120. The base layer 120 includes a plurality of base layer units 121 arranged in array and separated from each other, wherein the base layer units 121 are arranged as shown in FIG. 2A. At the time, the base layer 120 can be tightly bonded to the gas barrier substrate 110 and unlikely peeled off from the gas barrier substrate 110. In the step, the photolithography process is, for example, performed by using a mask to partially block the irradiation light so as to allow the light irradiating on specific regions of the light curing material 120'. The irradiated light curing material 120' in the specific regions is cured to form the base layer units 121. In more details, the thickness T3 of the base layer units 121 formed through the photolithography process may be different from the thickness T2 of the light curing material 120' spreading on the gas barrier substrate 110. The thickness T3 of the base layer units 121 herein is roughly from 0.1 m to 5 m. That is, the thickness T3 of the base layer units 121 is slightly smaller than the thickness T2 of the light curing material 120' spreading on the gas barrier substrate 110 without being subjected to the light irradiation of the photolithography process.

Then, referring to FIG. 1C, the electronic device 130 is formed on the base layer 120. In the embodiment, the electronic device 130 includes a plurality of electronic device units 131, and the electronic device units 131 are independent from each other. Thus, the electronic device units 131 are, for example, individually formed on the corresponding base layer units 121. Each of the electronic device units 131 in the embodiment includes a display device (e.g., e-paper or EPD), a light-emitting component, a transistor component, a solar cell or a combination thereof. When the electronic device unit 131 is a display device, each of the electronic device units 131 includes a plurality of display pixels arranged in array and further includes wires and pads for connecting the pixels to an external circuit. Therefore, a single electronic device unit 131 can be seen as a display panel to provide image display function. Each of the electronic device units 131 can be an organic electronic device made of organic material, which can be organic thin film transistor (OTFT) array, organic light-emitting diode (OLED) array and organic solar cells (OPV), wherein the OLED array is, for example, an active or a passive OLED array.

In the embodiment, the electronic device units 131 are only formed on an upper surface 121a of the base layer units 121 after finishing the base layer 120, so that the orthogonal projection area of the electronic device unit 131 on the gas barrier substrate 110 and the orthogonal projection area of the base layer unit 121 on the gas barrier substrate 110 are overlapped with each other. Since the electronic device units 131 and the base layer units 121 are respectively finished in different fabrication steps, the profile of the base layer unit 121 is independent from the profile of the electronic device unit 131. For example, FIG. 2B illustrates the base layer units 121 and the electronic device units 131 on the gas barrier substrate 110 in an embodiment, where the orthogonal projection area of the electronic device unit 131 on the gas barrier substrate 110 exposes a portion of the orthogonal projection area of the base layer unit 121 on the gas barrier substrate 110, i.e., the profile of the base layer unit 121 dos not coincide with the profile of the electronic device unit 131. For example, the distance D1 between the sidewall 132 of the electronic device unit 131 and the sidewall 122 of the base layer unit 121 is roughly from 0.5 mm to 3 mm, while the gap G between an edge of the gas barrier substrate 110 and the electronic device unit 131 adjacent to the edge of the gas barrier substrate 110 is roughly from 1 mm to 5 mm. In other embodiments, when the alignment accuracy during the fabrication process is properly controlled, the profiles of the base layer unit 121 and the electronic device unit 131 can coincide with each other so that the distance D1 is about 0, which the disclosure is not limited to.

Referring to FIG. 1D, the barrier film 140 is formed on and attached to the gas barrier substrate 110 so as to clad the electronic device 130 and the sidewall 122 of the base layer units 121. In the embodiment, the barrier film 140 can be a film capable of blocking moisture and oxygen-gas and the barrier film 140 is coated with glue (not shown in FIG. 1D). The barrier film 140 can be tightly attached to the electronic device units 131, the base layer units 121 and the gas barrier substrate 110 through hot lamination under normal pressure, i.e., there is no need to conduct lamination under vacuum environment in the case so as to save the fabrication time and cost.

In the embodiment, the thickness T4 of the barrier film 140 is, for example, greater than or equal to 75 m so as to clad the stacked base layer units 121 and the electronic device units 131. The light transmittance of the barrier film 140 is, for example, greater than 85% for ensuring the light exiting rate of the electronic device units 131.

After finishing the steps of FIGS. 1A-1D, the gas barrier substrate 110 is cut along a cutting line C1 by performing a separating process such as laser cutting, mechanical cutting, or other processes so that the gas barrier substrate 110 is divided to a plurality of substrate units 111. Each of the electronic device units 131 herein is located on one corresponding substrate unit 111 so that a plurality of electronic device packages 100 are separated and one electronic device package 100 is shown in FIG. 1E. In more details, in the electronic device package 100, the distance D2 between the sidewall 122 of the base layer unit 121 and the border of the bonded barrier film 140 or the substrate unit is greater than 5 mm. On the other hand, in consideration of the possible misalignment of the separating process, the distance D3 between any two adjacent electronic device units 131 may be greater than 0.5 mm to avoid damaging the stacks of the base layer units 121 and the electronic device units 131 during cutting the gas barrier substrate 110 into a plurality of substrate units 111 along the cutting line C1.

When the electronic device unit 131 in the electronic device package 100 is a display device, the electronic device package 100 is an independent display apparatus. Specifically, since the barrier film 140 of the electronic device packages 100 in the embodiment can entirely clad the sidewall 122 of the base layer units 121 and the electronic device units 131, the moisture and oxygen-gas are prevented from seeping into the package so as to prolong the lifetime of the electronic device units 131.

Figure 3A:
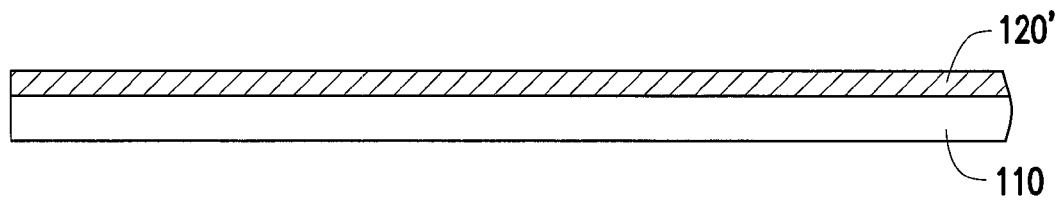
FIGS. 3A-3E schematically show the flows of the manufacturing method of an electronic device package according to the second embodiment of the disclosure.
Figure 3B:
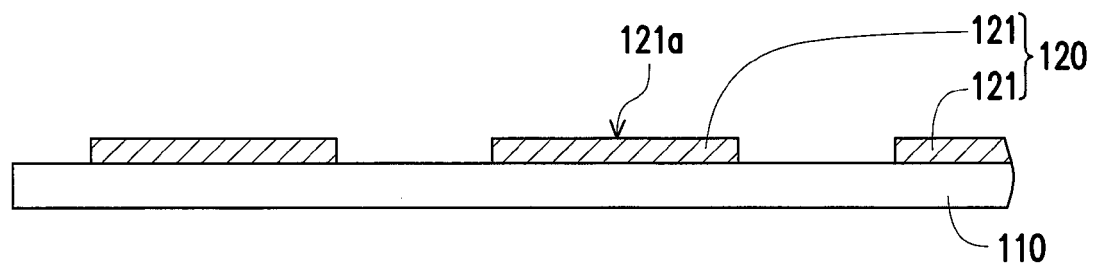
Figure 3C:
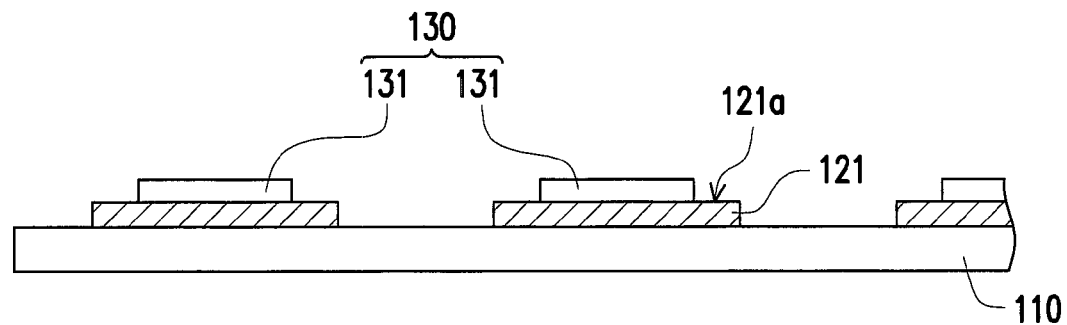
Figure 3D:
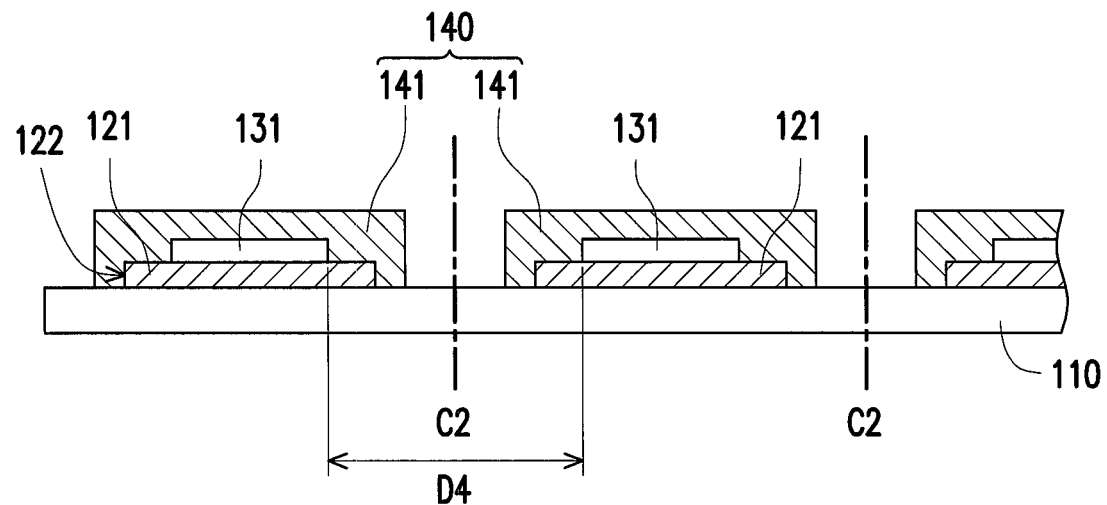
Figure 3E:
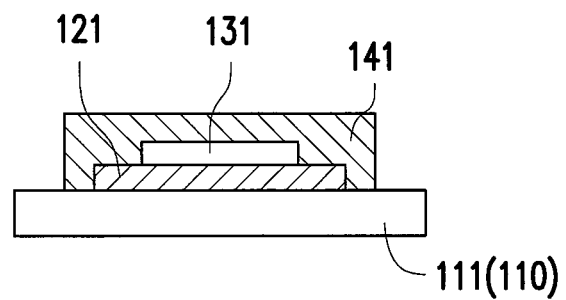
Figure 4:
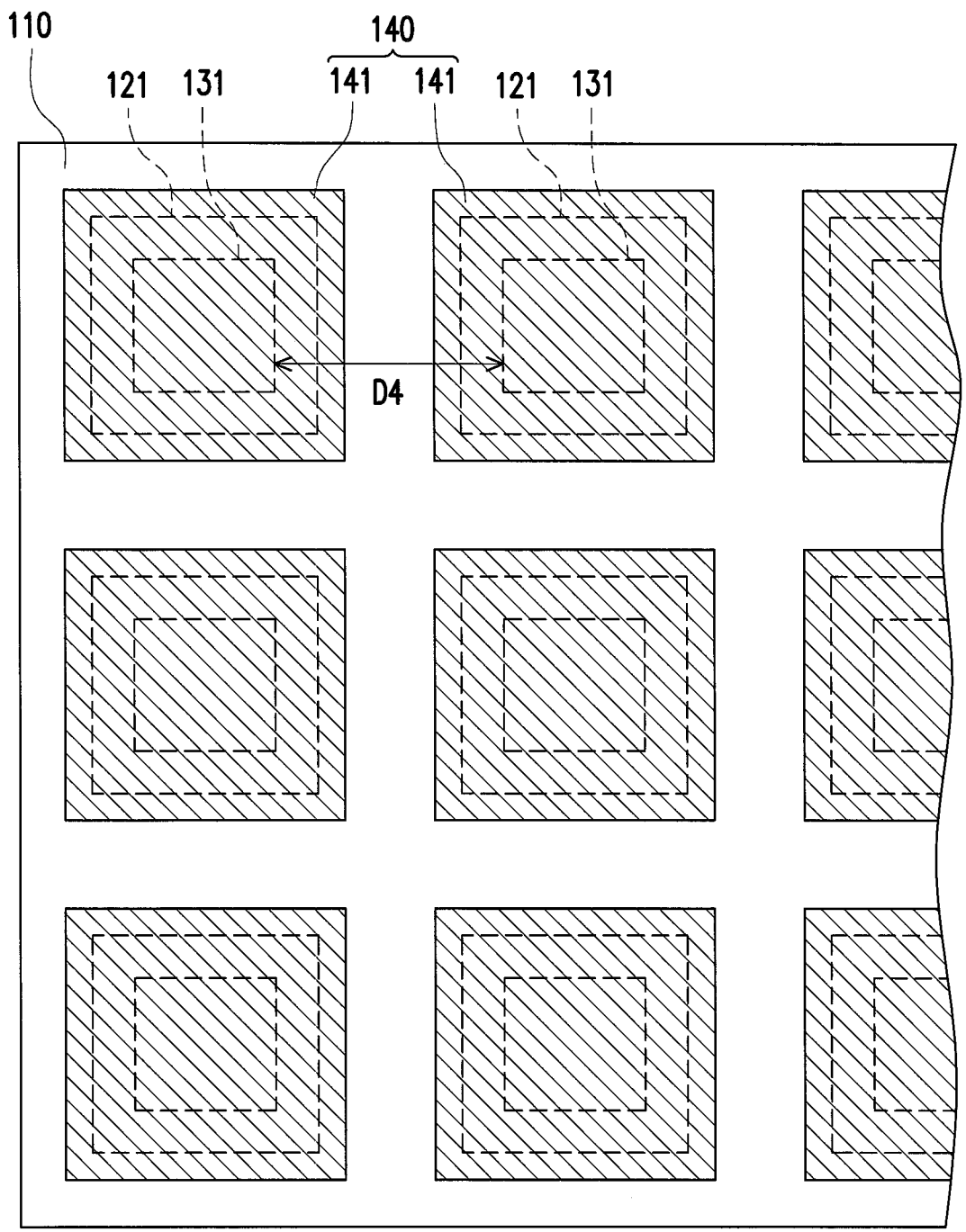
FIG. 4 is the top-view diagram of FIG. 3D.

FIGS. 3A-3E schematically shows the flows of the manufacturing method of an electronic device package according to the second embodiment of the disclosure and FIG. 4 is the top-view diagram of FIG. 3D. In the embodiment, the manufacturing method of FIGS. 3A-3C is basically the same as or similar to the manufacturing method of FIGS. 1A-1C, which can refer to the first embodiment for understanding and is omitted. Then, referring to FIGS. 3D and 4, when forming the barrier film 140 on the gas barrier substrate 110, the barrier film 140 is formed to include a plurality of barrier film units 141 arranged in array but separated from each other. Each of the barrier film units 141 is configured for packaging one of the electronic device units 131 and a corresponding base layer unit 121.

In the embodiment, these barrier film units 141 can respectively overlay the corresponding electronic device unit 131 and base layer unit 121, and are tightly attached to the gas barrier substrate 110 through hot lamination under normal pressure, where is no need to conduct lamination under vacuum environment so as to save the fabrication time and cost.

After conducting the processes of FIGS. 3A-3D, the gas barrier substrate 110 is cut along a cutting line C2 as shown by FIG. 3E by performing a separating process such as laser cutting, mechanical cutting or other processes so that to the gas barrier substrate 110 is divided to form a plurality of electronic device packages 100A. In consideration of the possible misalignment of the separating process, the distance D4 between any two adjacent electronic device units 131 must be greater than 1 mm to avoid damaging the stack of the base layer units 121 and the electronic device unit 131 during cutting the gas barrier substrate 110 into a plurality of substrate units 111 along the cutting line C2. Since the barrier film units 141 of the electronic device packages 100A in the embodiment can entirely clad the corresponding base layer units 121 and the electronic device units 131, the moisture and oxygen-gas can be effectively prevented from seeping into the package so as to prolong the lifetime of the electronic device units 131.

When the gas barrier substrate 110 has flexibility, the above-mentioned manufacturing method of an electronic device package in the embodiments can be finished by using a roll-to-roll (R2R) process. The R2R process is explain in following against the manufacturing method of the electronic device package 100 in the first embodiment where the same or similar notations represent the same or similar parts, while the depiction for the same parts are omitted to describe.

Figure 5:
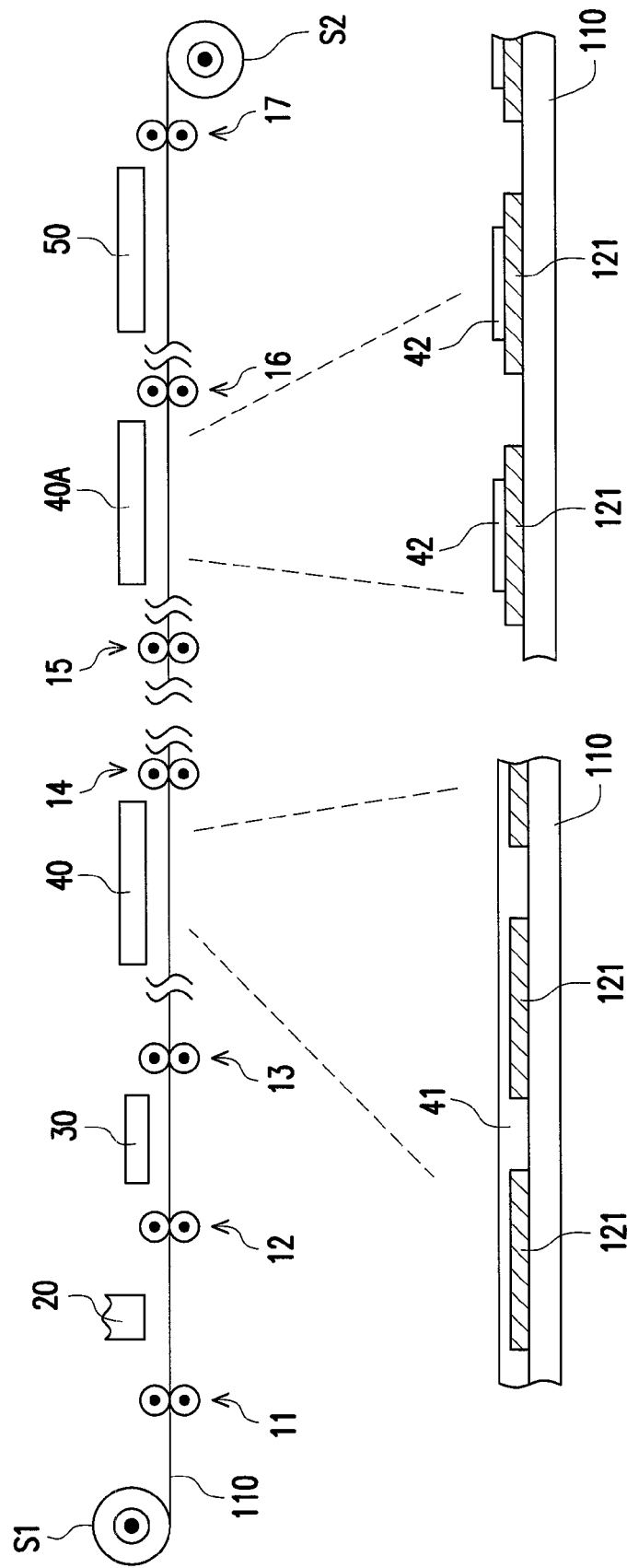
FIG. 5 is a diagram showing a roll-to-roll process of fabricating an electronic device package according to the first embodiment of the disclosure.

FIG. 5 is a diagram showing a roll-to-roll process of an electronic device package according to the first embodiment of the disclosure. Referring to FIG. 5, in the embodiment, the gas barrier substrate 110 is rolled into a structural roll S1. The gas barrier substrate 110 can be released from the structural roll S1 due to the driving of a first roller set 11 and transferred durably under the driving of a second roller set 12. Then, an injection head 20 spreads the light curing material 120' onto the gas barrier substrate 110, as shown by FIG. 1A.

At the time, the gas barrier substrate 110 spread with the light curing material 120' are driven by the second roller set 12 and a third roller set 13 simultaneously to be transferred durably and subsequently irradiated by a lithography machine 30 to be cured into the base layer 120, wherein the base layer 120 is tightly attached to the gas barrier substrate 110. Under the lithography machine 30, a photolithography process is performed to pattern the base layer 120 into a plurality of base layer units 121 arranged in array and separated from each other, as shown by FIGS. 1B and 2A.

Then, in order to fabricate the electronic device 130 of FIGS. 1C and 2B, the third roller set 13 and a fourth roller set 14 drive and transfer durably the gas barrier substrate 110 so as to deliver the gas barrier substrate 110 with a plurality of base layer units 121 arranged in array and separated from each other to the station where a depositing machine 40 stands. Specifically, the depositing machine 40 forms a material layer 41 on the base layer units 121 by using physical vapour deposition (PVD) or chemical vapour deposition (CVD), wherein the material of the material layer 41 can include inorganic material such as metal or metal oxide, or organic material.

Thereafter, under the driving of the fourth roller set 14 and a fifth roller set 15, the gas barrier substrate 110 is transferred durably to the station where the injection head 20 and the lithography machine 30 stand so as to form the required patterned photoresist on the material layer 41. Then, under the driving of a sixth roller set 16 and other related transferring mechanism, the aforementioned gas barrier substrate 110 is transferred durably to an etching machine 40A where the material layer 41 is patterned to form a device layer 42 by the etching machine 40A. The device layer 42 comprises at least one part in each of the electronic device units 131 of the electronic device 130 by the etching machine 40A. Then, the above-mentioned steps of depositing and patterning the material layer are repeated to fabricate all the parts of the electronic device units 131. In the case that at least one of the parts of the electronic device units 131 does not need to be patterned, only the step of depositing the material layer is needed for forming this part. On the other hand, after patterning the material layer into the device layer 42 every time, the unwanted residue material can be removed in a cleaning machine (not shown) to facilitate the successive process.

In the embodiment, the steps of fabricating the base layer 120 and the electronic device 130 can be conducted by using a same machine, for example, by using the injection head 20 and the lithography machine 30. Since the electronic device units 131 are formed on the upper surface 121a of the base layer units 121 after finishing the base layer 120, the orthogonal projection area of the electronic device unit 131 on the gas barrier substrate 110 and the orthogonal projection area of the base layer unit 121 on the gas barrier substrate 110 are overlapped with each other. In addition, it can be seen from the aforementioned depiction, the orthogonal projection area of the electronic device unit 131 on the gas barrier substrate 110 exposes a portion of the orthogonal projection area of the base layer unit 121 on the gas barrier substrate 110, as shown by FIG. 2B.

Finally, a seventh roller set 17 drives and durably transfers the gas barrier substrate 110 so as to package the barrier film 140 on the gas barrier substrate 110 by using a packaging machine 50, where the barrier film 140 is attached to the gas barrier substrate 110 to clad the electronic device 130 and the base layer 120, as shown by FIG. 1D. In the embodiment, the barrier film 140 is a film able to block moisture and oxygen-gas and coated with back glue (not shown). Thus, the barrier film 140 can be tightly attached to the electronic device units 131, the base layer units 121 and the gas barrier substrate 110 through hot lamination under normal pressure, as shown by FIG. 1D, where is no need to conduct lamination under vacuum environment so as to save the fabrication time and cost. After conducting the aforementioned manufacturing method, the gas barrier substrate 110 can be rolled to become a structural roll S2 available for the successive process, or a monomeric process (such as laser cutting, mechanical cutting or other processes) is conducted where the gas barrier substrate 110 is cut into a plurality of independent electronic device packages 100.

It should be noted that each of the first roller set 11, the second roller set 12, the third roller set 13, the fourth roller set 14, the fifth roller set 15, the sixth roller set 16 and the seventh roller set 17 respectively includes a driving roller and a driven roller, wherein the driving roller, for example, drives, while the driven roller is able to guide the transferring direction, which the disclosure is not limited to. On the other hand, the electronic device package 100A of the second embodiment is similar to the electronic device package 100 of the first embodiment; however the R2R process of the electronic device packages 100A in the second embodiment is adjusted somehow depending on the difference.

In summary, since the electronic device package of the disclosure adopts the gas barrier substrate to package the electronic device and a light curable material is used to form the patterned base layer on the gas barrier substrate, the electronic device is disposed on the base layer. At the time, the barrier film dads not only the electronic device, but also the base layer so as to improve the ability of blocking moisture and oxygen-gas of the entire package. The barrier film is coated with back glue so that the barrier film can be tightly attached to the electronic device, the base layer and the gas barrier substrate through hot lamination under normal pressure so as to block the possible path for the moisture and oxygen-gas to seep in the package, which prevents the electronic device from wetting or oxidation to prolong the lifetime thereof. In addition, the manufacturing method of an electronic device package can be finished through a R2R process so as to save the fabrication time and cost.

It will be apparent to those skilled in the art that the descriptions above are several preferred embodiments of the disclosure only, which does not limit the implementing range of the disclosure. Various modifications and variations can be made to the structure of the disclosure without departing from the scope or spirit of the disclosure. The claim scope of the disclosure is defined by the claims hereinafter.

What is claimed is:

1. An electronic device package, comprising:
    a gas barrier substrate;
    a base layer, disposed on the gas barrier substrate and made of a light curing material;
    an electronic device, disposed on the base layer; and
    a barrier film, disposed on the gas barrier substrate, wherein the barrier film and the gas barrier substrate clad the electronic device and sidewall of the base layer.

2. The electronic device package as claimed in claim 1, wherein the electronic device comprises a plurality of electronic device units and the electronic device units are independent from each other.

3. The electronic device package as claimed in claim 2, wherein the base layer comprises a plurality of base layer units arranged in an array and separated from each other, and each of the electronic device units is disposed on a corresponding one of the base layer units.

4. The electronic device package as claimed in claim 3, wherein the barrier film comprises a plurality of barrier film units arranged in an array and separated from each other, and each of the barrier film units overlays one of the electronic device units and a corresponding base layer unit.

5. The electronic device package as claimed in claim 3, wherein the barrier film overlays the electronic device units and the base layer units.

6. The electronic device package as claimed in claim 1, wherein the gas barrier substrate comprises a flexible substrate.

7. The electronic device package as claimed in claim 1, wherein a material of the gas barrier substrate comprises an inorganic material.

8. The electronic device package as claimed in claim 1, wherein an area of the electronic device exposes a portion of an area of the base layer.

9. The electronic device package as claimed in claim 1, wherein the electronic device comprises display components, light-emitting components, transistor components, solar cells or a combination thereof.

10. The electronic device package as claimed in claim 1, wherein a material of the electronic device comprises an organic electronic device.

11. The electronic device package as claimed in claim 1, wherein a material of the base layer comprises an ultraviolet light curable resin, a photoresist material, a light curable material or a combination of the aforementioned materials.

12. A manufacturing method of an electronic device package, comprising:
    forming a base layer on a gas barrier substrate using a light curable material;
    after curing the light curable material into the base layer, forming an electronic device on the base layer; and
    attaching a barrier film to the gas barrier substrate, wherein the barrier film clads the electronic device and the base layer.

13. The manufacturing method of an electronic device package as claimed in claim 12, wherein the forming the electronic device comprises forming a plurality of electronic device units on the base layer, wherein the electronic device units are independent from each other.

14. The manufacturing method of an electronic device package as claimed in claim 13, wherein the forming the base layer comprises patterning the base layer into a plurality of base layer units, followed by forming each of the electronic device units on one of the base layer units.

15. The manufacturing method of an electronic device package as claimed in claim 14, wherein the barrier film is formed to overlay the electronic device units.

16. The manufacturing method of an electronic device package as claimed in claim 14, wherein the barrier film is formed to have a plurality of barrier film units respectively overlaying the electronic device units and the base layer units.

17. The manufacturing method of an electronic device package as claimed in claim 14, further comprising cutting the gas barrier substrate into a plurality of substrate units, wherein each of the electronic device units is located on one of the substrate units.

18. The manufacturing method of an electronic device package as claimed in claim 12, wherein the forming the base layer using the light curable material comprises a lithography process.

19. The manufacturing method of an electronic device package as claimed in claim 12, wherein the base layer and the electronic device are fabricated by using a same machine.

* * * * *